(12) United States Patent
Yao et al.

(10) Patent No.: US 11,069,712 B2
(45) Date of Patent: Jul. 20, 2021

(54) THREE-DIMENSIONAL MEMORY DEVICE

(71) Applicant: Yangtze Memory Technologies Co., Ltd., Wuhan (CN)

(72) Inventors: Lan Yao, Wuhan (CN); Lei Xue, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/935,223

(22) Filed: Jul. 22, 2020

(65) Prior Publication Data

US 2020/0350335 A1 Nov. 5, 2020

Related U.S. Application Data

(63) Continuation of application No. 16/292,212, filed on Mar. 4, 2019, now Pat. No. 10,854,628, which is a
(Continued)

(51) Int. Cl.
*H01L 29/792* (2006.01)
*H01L 27/11582* (2017.01)
(Continued)

(52) U.S. Cl.
CPC .... *H01L 27/11582* (2013.01); *H01L 21/0223* (2013.01); *H01L 27/1157* (2013.01); *H01L 29/40114* (2019.08); *H01L 29/40117* (2019.08)

(58) Field of Classification Search
CPC ......... H01L 27/11524; H01L 27/11529; H01L 27/11578–11582; H01L 27/1157;
(Continued)

(56) References Cited

U.S. PATENT DOCUMENTS 9,627,405 B1   4/2017  Lee
9,659,956 B1 *  5/2017  Pachamuthu ..... H01L 27/11573
(Continued)

FOREIGN PATENT DOCUMENTS

CN       107564915 A      1/2018
CN       107731671 A      2/2018
(Continued)

*Primary Examiner* — Calvin Y Choi
(74) *Attorney, Agent, or Firm* — Winston Hsu

(57) ABSTRACT

A three-dimensional (3D) memory device is provided. The 3D memory device includes a substrate, an alternating conductive/dielectric stack, an epitaxial layer, and a vertical structure. The alternating conductive/dielectric stack is disposed on the substrate. The alternating conductive/dielectric stack includes a plurality of dielectric layers and a plurality of conductive layers alternately stacked in a vertical direction perpendicular to a surface of the substrate. The epitaxial layer is disposed between the substrate and the alternating conductive/dielectric stack in the vertical direction. The vertical structure penetrates the alternating conductive/dielectric stack in the vertical direction for being partly disposed in the epitaxial layer. The epitaxial layer includes a protruding part disposed between the vertical structure and a bottom dielectric layer of the alternating conductive/dielectric stack in a horizontal direction orthogonal to the vertical direction.

7 Claims, 10 Drawing Sheets

Related U.S. Application Data continuation of application No. PCT/CN2019/070871, filed on Jan. 8, 2019.

(51) Int. Cl.
*H01L 27/1157* (2017.01)
*H01L 21/02* (2006.01)
*H01L 21/28* (2006.01)

(58) Field of Classification Search
CPC ........ H01L 27/11551–11556; H01L 29/40114; H01L 29/40117; H01L 21/0223
USPC .......................................................... 257/324
See application file for complete search history.

(56) References Cited

U.S. PATENT DOCUMENTS

| | | | | |
|---|---|---|---|---|
| 2008/0173928 A1* | 7/2008 | Arai | ................. | H01L 27/11556 257/316 |
| 2017/0309635 A1* | 10/2017 | Kim | ................. | H01L 27/11582 |
| 2017/0365612 A1 | 12/2017 | Yun | | |
| 2018/0323213 A1 | 11/2018 | Arai | | |
| 2018/0337195 A1 | 11/2018 | Jayanti | | |
| 2018/0366488 A1 | 12/2018 | Choi | | |
| 2019/0067322 A1 | 2/2019 | Chen | | |

FOREIGN PATENT DOCUMENTS

| | | |
|---|---|---|
| CN | 107996000 A | 5/2018 |
| CN | 108511447 A | 9/2018 |
| CN | 208208759 U | 12/2018 |
| CN | 109155316 A | 1/2019 |
| TW | 201131747 A1 | 9/2011 |
| TW | 201138115 A1 | 11/2011 |
| TW | 201532131 A | 8/2015 |
| TW | 201712912 A | 4/2017 |
| TW | 201725662 A | 7/2017 |
| TW | 201834150 A | 9/2018 |

\* cited by examiner

THREE-DIMENSIONAL MEMORY DEVICE

CROSS REFERENCE TO RELATED APPLICATIONS

This application is a continuation of application Ser. No. 16/292,212 filed on Mar. 4, 2019, which is a continuation of International Application No. PCT/CN2019/070871 filed on Jan. 8, 2019 and incorporated by reference herein in its entirety.

BACKGROUND OF THE INVENTION

1. Field of the Invention

The present disclosure relates to a memory device, and more particularly, to a three-dimensional (3D) memory device.

2. Description of the Prior Art

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral devices for controlling signals to and from the memory array. In conventional 3D memory architecture, memory strings are formed in channel holes penetrating a multiple layer stack structure on a semiconductor substrate. An epitaxial structure is formed at the bottom of each channel hole for electrically connecting a channel layer of the memory string and the semiconductor substrate. However, the etching process for forming the channel holes may cause damage to the semiconductor substrate and affects the quality of the epitaxial structures formed at the bottom of the channel holes. It is difficult to control the quality of the epitaxial structures especially when the density of the channel holes increases. In addition, a part of an ONO structure formed on the epitaxial structure has to be removed by an etching process for exposing the epitaxial structure, and the etching process may cause damage to the ONO structure and/or the channel layer of the memory string. Therefore, the structure and/or the manufacturing processes of the 3D memory device have to be modified for improving the electrical performance and/or the manufacturing yield of the 3D memory device.

SUMMARY OF THE INVENTION

A three-dimensional (3D) memory device is provided in the present disclosure. A bottom dielectric layer of an alternating dielectric stack formed on a substrate is removed after forming a vertical structure penetrating the alternating dielectric stack and before forming an epitaxial layer between the substrate and the alternating dielectric stack. The influence of the step of forming the vertical structure on the epitaxial layer may be avoided. Defects at the interface between the epitaxial layer and the bottom dielectric layer of the alternating dielectric stack may be reduced because the bottom dielectric layer of the alternating dielectric stack is replaced by the insulating layer formed on the epitaxial layer. The manufacturing yield and the electrical performance of the 3D memory device may be enhanced accordingly.

According to an embodiment of the present disclosure, a 3D memory device is provided. The 3D memory device includes a substrate, an alternating conductive/dielectric stack, an epitaxial layer, and a vertical structure. The alternating conductive/dielectric stack is disposed on the substrate. The alternating conductive/dielectric stack includes a plurality of dielectric layers and a plurality of conductive layers alternately stacked in a vertical direction perpendicular to a surface of the substrate. The epitaxial layer is disposed between the substrate and the alternating conductive/dielectric stack in the vertical direction. The vertical structure penetrates the alternating conductive/dielectric stack in the vertical direction for being partly disposed in the epitaxial layer. The epitaxial layer includes a protruding part disposed between the vertical structure and a bottom dielectric layer of the alternating conductive/dielectric stack in a horizontal direction orthogonal to the vertical direction.

In some embodiments, the bottom dielectric layer of the alternating conductive/dielectric stack surrounds the protruding part of the epitaxial layer in the horizontal direction.

In some embodiments, a top surface of the epitaxial layer is higher than a bottom surface of the bottom dielectric layer in the vertical direction.

In some embodiments, the vertical structure includes a semiconductor layer and a storage layer surrounding the semiconductor layer.

In some embodiments, the epitaxial layer contacts the semiconductor layer of the vertical structure.

In some embodiments, the protruding part of the epitaxial layer surrounds and contacts the semiconductor layer of the vertical structure.

In some embodiments, the epitaxial layer directly contacts the storage layer.

In some embodiments, the epitaxial layer includes a doped well region on the substrate.

In some embodiments, the epitaxial layer is a doped well region comprising the protruding part and disposed on the substrate.

Other aspects of the present disclosure can be understood by those skilled in the art in light of the description, the claims, and the drawings of the present disclosure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 2-8 are schematic drawings illustrating the manufacturing method of the 3D memory device according to the first embodiment of the present disclosure, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG.

6 is a schematic drawing in a step subsequent to FIG. 5, FIG. 7 is a schematic drawing in a step subsequent to FIG. 6, and FIG. 8 is a schematic drawing in a step subsequent to FIG. 6.

DETAILED DESCRIPTION

Figure 1:
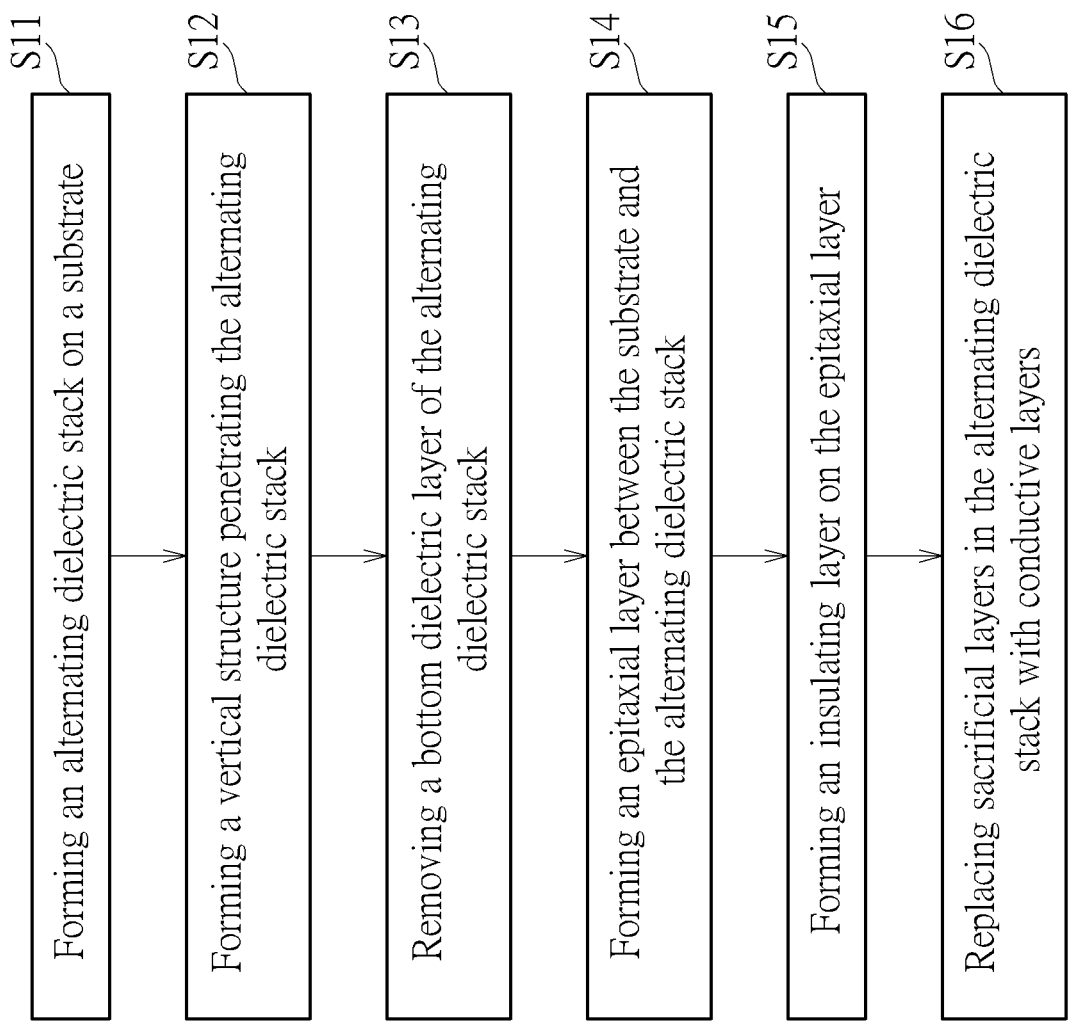
FIG. 1 is a flowchart of a manufacturing method of a 3D memory device according to a first embodiment of the present disclosure.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
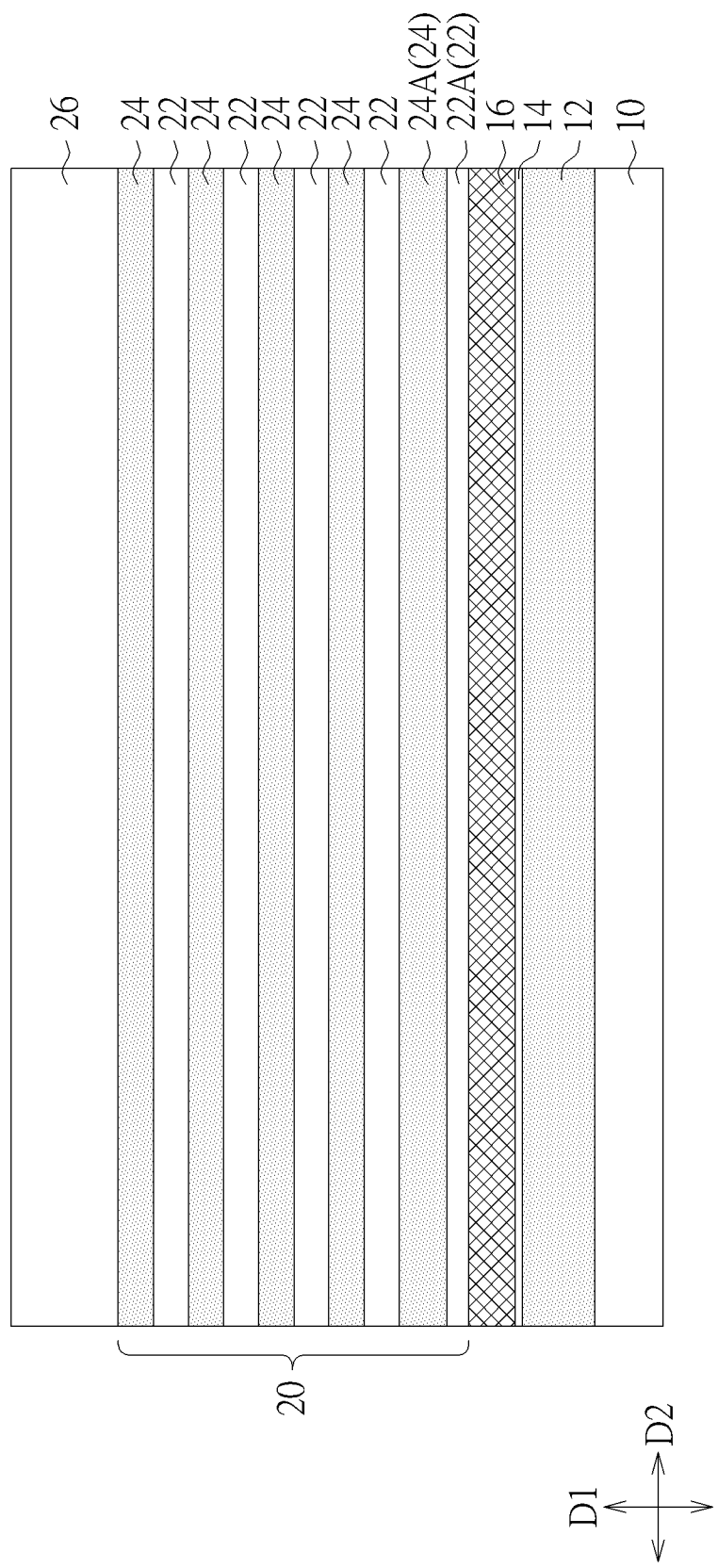

Please refer to FIGS. 1-8. FIG. 1 is a flowchart of a manufacturing method of a 3D memory device according to a first embodiment of the present disclosure. FIGS. 2-8 are schematic drawings illustrating the manufacturing method of the 3D memory device in this embodiment. A manufacturing method of a 3D memory device is provided, and the manufacturing method includes the following steps. As shown in FIG. 1 and FIG. 2, in step S11, a substrate 10 is provided, and an alternating dielectric stack 20 is formed on the substrate 10. In some embodiments, the alternating dielectric stack 20 may include a plurality of dielectric layers 22 and a plurality of sacrificial layers 24 alternately stacked in a vertical direction D1 perpendicular to a surface of the substrate 10, but not limited thereto. The dielectric layers 22 and the sacrificial layers 24 in the alternating dielectric stack 20 may include dielectric materials including, but not limited to, silicon oxide, silicon nitride, silicon oxynitride, or any combination thereof. In some embodiments, the material composition of the dielectric layer 22 may be different from the material composition of the sacrificial layer 24 for providing the required etching selectivity in the step of forming a staircase structure (not shown) at least on one lateral side of the alternating dielectric stack 20. For instance, each of the dielectric layers 22 may be a silicon oxide layer, and each of the sacrificial layers 24 may be a silicon nitride layer, but not limited thereto. In some embodiments, the total numbers of the dielectric layers 22 and the sacrificial layers 24 in the dielectric stack may be 32 or 64, but not limited thereto.

In some embodiments, the vertical direction D1 may also be regarded as a thickness direction of the substrate 10, and the substrate 10 may include silicon (e.g., monocrystalline silicon, polycrystalline silicon), silicon germanium (SiGe), silicon carbide (SiC), gallium nitride (GaN), indium phosphide (InP), gallium arsenide (GaAs), germanium (Ge), silicon on insulator (SOI), germanium on insulator (GOI), or any suitable combination thereof. Additionally, in some embodiments, a first doped region 12 and a protection layer 14 may be formed before the step of forming the alternating dielectric stack 20, but not limited thereto. In some embodiments, the first doped region 12 may be a doped well formed in the substrate 10 by an implantation process, and the protection layer 14 may be formed on the substrate 10 before the implantation process. For example, when the substrate 10 is a P type semiconductor substrate, the first doped region 12 may be a P type doped well formed in the substrate 10, but not limited thereto. In some embodiments, the protection layer 14 may include an oxide layer formed by performing an oxidation treatment to the substrate 10 before forming the first doped region 12. In some embodiments, a dummy layer 16 may be formed on the substrate 10 before forming the alternating dielectric stack 20, and the dummy layer 16 may be located between the substrate 10 and the alternating dielectric stack 20 in the vertical direction D1. Specifically, the dummy layer 16 may be located between the protection layer 14 and the alternating dielectric stack 20 in the vertical direction D1. The dummy layer 16 may include polysilicon, amorphous silicon, or other suitable sacrificial materials different from the material of the dielectric layer 22 and the material of the sacrificial layer 24.

Figure 3:
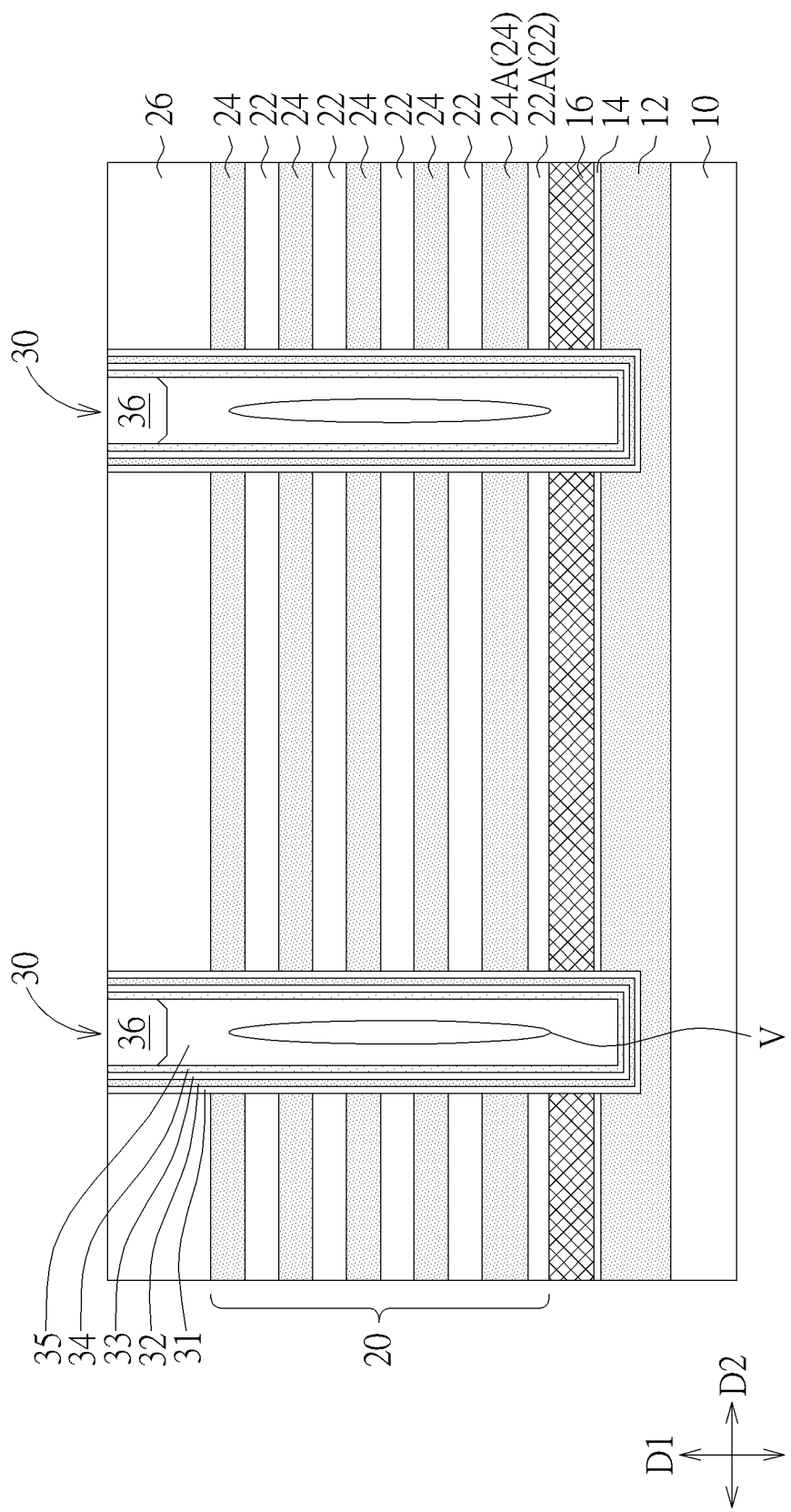

As shown in FIGS. 1-3, in step S12, one or more vertical structures 30 may be formed penetrating the alternating dielectric stack 20 in the vertical direction D1. In some embodiments, the vertical structure 30 may penetrate the alternating dielectric stack 20, the dummy layer 16, and the protection layer 14 in the vertical direction D1 for being partly disposed in the first doped region 12, and the vertical structure 30 does not penetrate the first doped region 12 preferably, but not limited thereto. Therefore, a lower portion of the vertical structure 30 may be located below the alternating dielectric stack 20 in the vertical direction D1 and be surrounded by the dummy layer 16 in a horizontal direction D2 orthogonal to the vertical direction D1. In some embodiments, a first cap layer 26 may be formed on the alternating dielectric stack 20 before the step of forming the vertical structures 30, and each of the vertical structures 30 may further penetrate the first cap layer 26 in the vertical direction D1. The first cap layer 26 may include an oxide layer, such as a silicon oxide layer, or other suitable insulation materials.

The vertical structure 30 may include a vertical memory structure, such as a NAND string or other suitable vertical memory structures. For example, the vertical structure 30 may include a barrier layer 31, a storage layer 32, a tunneling layer 33, a semiconductor layer 34, a filling structure 35, and a conductive structure 36. The vertical structure 30 may be formed by forming a channel hole vertically penetrating the first cap layer 26, the alternating dielectric stack 20, the dummy layer 16, and the protection layer 14 and partly located in the first doped region 12; forming the barrier layer 31 conformally on the surface of the channel hole; forming the storage layer 32 conformally on the barrier layer 32; forming the tunneling layer 33 conformally on the storage layer 32; forming the semiconductor layer 34 conformally on the tunneling layer 33; forming the filling structure 35 on the semiconductor layer 34; and forming the conductive structure 36 on the filling structure 35. Therefore, the semiconductor layer 34 may surround the filling structure 35 in the horizontal direction D2, and the tunneling layer 33, the storage layer 32, and the barrier layer 31 may surround the semiconductor layer 34 in the horizontal direction D2. The barrier layer 31, the storage layer 32, the tunneling layer 33, the semiconductor layer 34, the filling structure 35, and the conductive structure 36 may be respectively formed by one or more thin film deposition processes, such as ALD, CVD, PVD, any other suitable processes, or any combination thereof, and one or more planarization processes and/or etching back process may be performed for forming the vertical structures 30, but not limited thereto.

In some embodiments, the barrier layer 31 may be used for blocking the outflow of the electronic charges, and the barrier layer 31 may include a silicon oxide layer or a combination of silicon oxide/silicon nitride/silicon oxide (ONO) layers. In some embodiments, the barrier layer 31 may include high dielectric constant (high-k) dielectrics (e.g., aluminum oxide), but not limited thereto. Electrons or holes from the semiconductor layer 34 may tunnel to the storage layer 32 through the tunneling layer 33. The storage layer 32 may be used for storing electronic charges (electrons or holes) for memory operation. In some embodiments, the storage or removal of charge in the storage layer 32 can impact the on/off state and/or a conductance of the semiconductor channel, and the storage layer 32 may include one or more films of materials including, but are not limited to, silicon nitride, silicon oxynitride, a combination of silicon oxide and silicon nitride, or any combination thereof. In some embodiments, the tunneling layer 33 may be used for tunneling electronic charges (electrons or holes), and the tunneling layer 33 may include dielectric materials including, but not limited to, silicon oxide, silicon nitride, silicon oxynitride, or any combination thereof. In some embodiments, the semiconductor layer 34 may include amorphous silicon, polysilicon, or other suitable semiconductor materials. In some embodiments, the filling structure 35 may include oxide or other suitable insulation materials, and the filling structure 35 may include one or more air voids V, but not limited thereto. In some embodiments, the conductive structure 36 may be formed on a recess above the filling structure 35, and the conductive structure 36 may include polysilicon or other suitable conductive materials. It is worth noting that the vertical structure 30 of the present disclosure is not limited to the components and the manufacturing approaches described above. In some embodiments, the vertical structure 30 may include other components and/or be formed by other manufacturing approaches.

Figure 4:
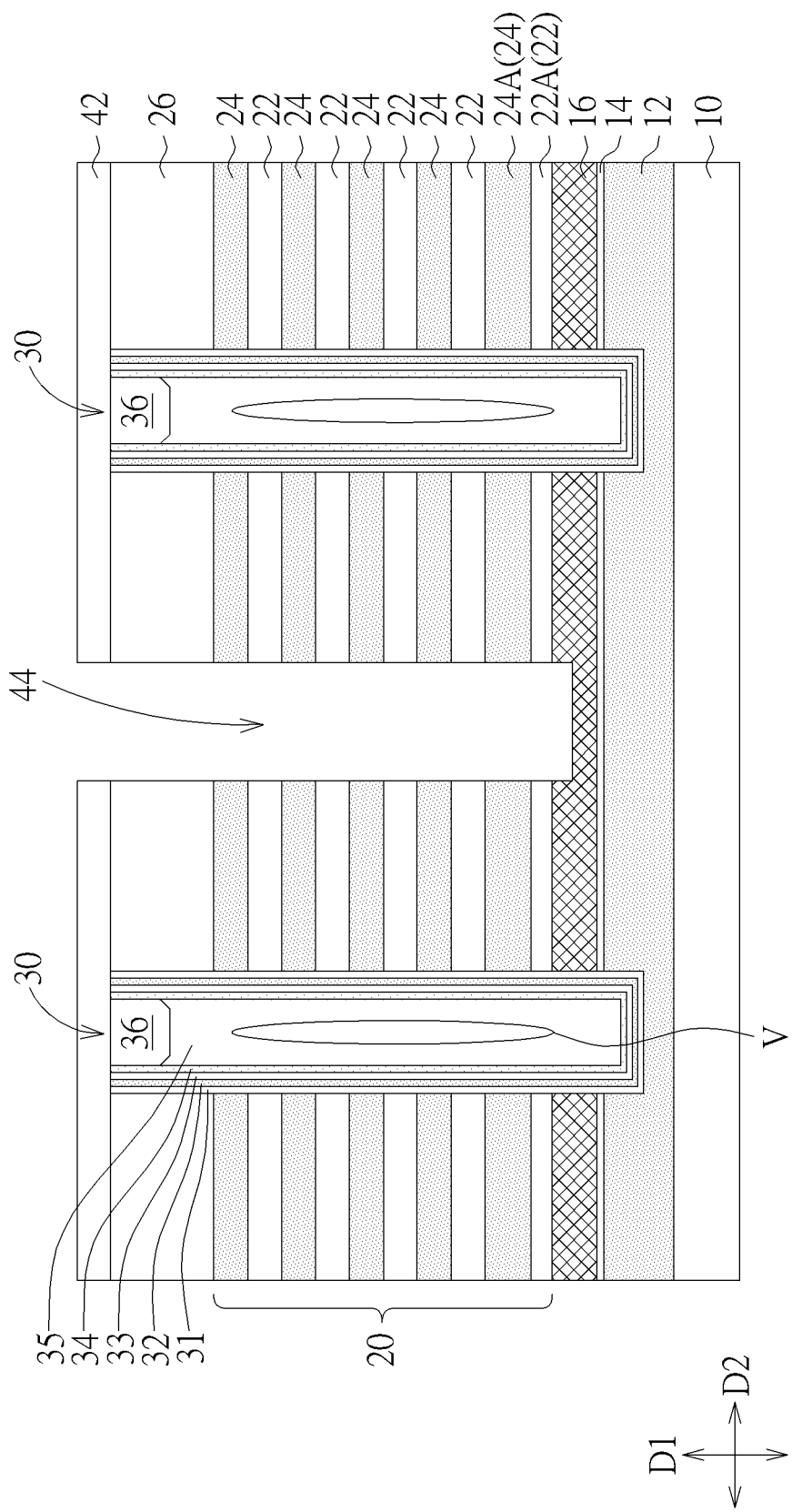
Figure 5:
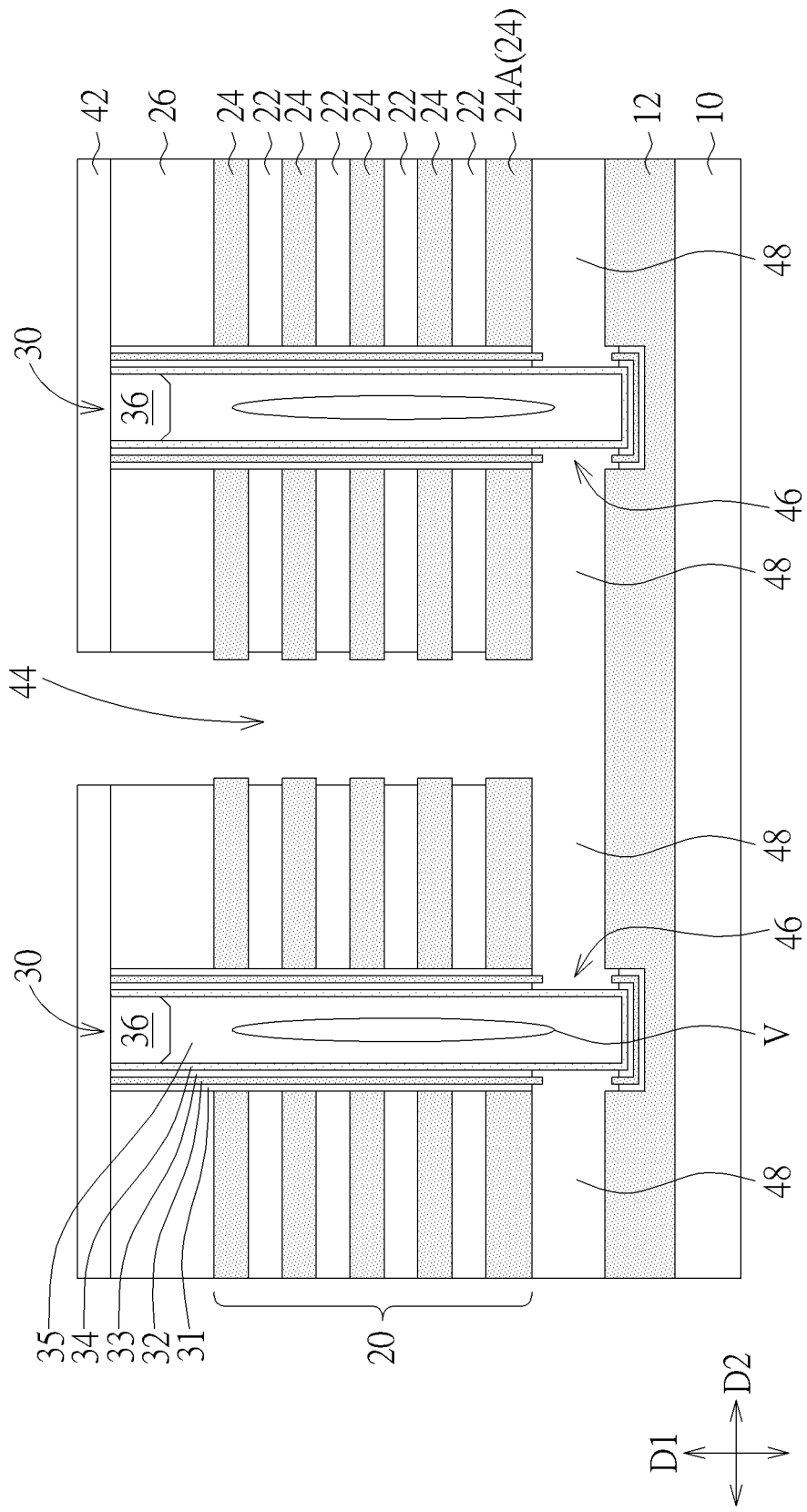

As shown in FIGS. 1, 4, and 5, in step S13, a bottom dielectric layer 22A of the alternating dielectric stack 20 is removed. The bottom dielectric layer 22A is the bottommost dielectric layer 22 in the alternating dielectric stack 20, and the bottom dielectric layer 22A may directly contact the dummy layer 16 in some embodiments, but not limited thereto. In some embodiments, one or more slits 44 may be formed vertically penetrating the first cap layer 26 and the alternating dielectric stack 20 for exposing a part of the dummy layer 16 after the step of forming the vertical structures 30 and before the step of removing the bottom dielectric layer 22A. Additionally, in some embodiments, a second cap layer 42 may be formed on the first cap layer 26 and the vertical structures 30 before the step of forming the slit 44, and the slit 44 may further penetrate the second cap layer 42 in the vertical direction D1. The second cap layer 42 may include an oxide layer, such as a silicon oxide layer, or other suitable insulation materials. The bottom dielectric layer 22A may be removed by one or more etching processes via the slit 44. Specifically, in some embodiments, the dummy layer 16 may be removed by an etching process (such as a suitable wet etching process) before the step of removing the bottom dielectric layer 22A and after the step of forming the vertical structures 30. After removing the dummy layer 16, a part of the vertical structure 30 may be exposed, and one or more etching processes may be performed to remove a part of the barrier layer 31, a part of the storage layer 32, and a part of the tunneling layer 33 for exposing a part of the semiconductor layer 34 of the vertical structure 30. In some embodiments, an opening 46 may be formed laterally penetrating (e.g. in the horizontal direction D2) the barrier layer 31, the storage layer 32, and the tunneling layer 33 for exposing a part of the semiconductor layer 34 below the alternating dielectric stack 20, and the opening 46 may be located between the alternating dielectric stack 20 and the first doped region 12 in the vertical direction D1.

Additionally, the protection layer 14 and the bottom surface of the bottom dielectric layer 22A may also be exposed after the step of removing the dummy layer 16. In some embodiments, the protection layer 14, a part of the barrier layer 31, and a part of the bottom dielectric layer 22A may be removed by an etching process, such as a wet etching process, especially when the materials of the protection layer 14, the barrier layer 31, and the bottom dielectric layer 22A are similar to one another. In some embodiments, the remaining bottom dielectric layer 22A may be removed subsequently by an etching process for removing the tunneling layer 33. For removing the bottom dielectric layer 22A completely and reducing etching damages to other dielectric layers 22 in the alternating dielectric stack 20, the thickness of the bottom dielectric layer 22A may be less than the thickness of each of other dielectric layers 22 in the alternating dielectric stack 20 preferably, but not limited thereto. In addition, the thickness of the bottom sacrificial layer 24A may be larger than the thickness of each of other sacrificial layers 24 in the alternating dielectric stack 20 preferably for providing space for forming a replacement of the bottom dielectric layer 22A subsequently, but not limited thereto. After removing the dummy layer 16, the protection layer 14, and the bottom dielectric layer 22A, a gap 48, such as an air gap, may be formed between the first doped region 12 and the alternating dielectric stack 20 in the vertical direction D1.

As shown in FIGS. 1, and 4-6, in step S14, an epitaxial layer 50 is formed between the substrate 10 and the alternating dielectric stack 20 after removing the bottom dielectric layer 22A. In some embodiments, the epitaxial layer 50 may be a polysilicon layer formed on the first doped region 12 by a selective epitaxial growth (SEG) process, and the epitaxial layer 50 may grow at the surface of the first doped region 12 and/or the surface of the semiconductor layer 34 exposed by the opening 46, but not limited thereto. The epitaxial layer 50 may include other suitable epitaxial materials and/or be formed by other suitable processes in some embodiments. The epitaxial layer 50 may directly contact and be electrically connected with the semiconductor layer 34 of the vertical structure 30, such as the part of the semiconductor layer 34 exposed by the opening 46, but not limited thereto. In some embodiments, the epitaxial layer 50 may become a part of the first doped region 12 because the dopant (such as boron) in the first doped region 12 may diffuse into the epitaxial layer 50.

Figure 6:
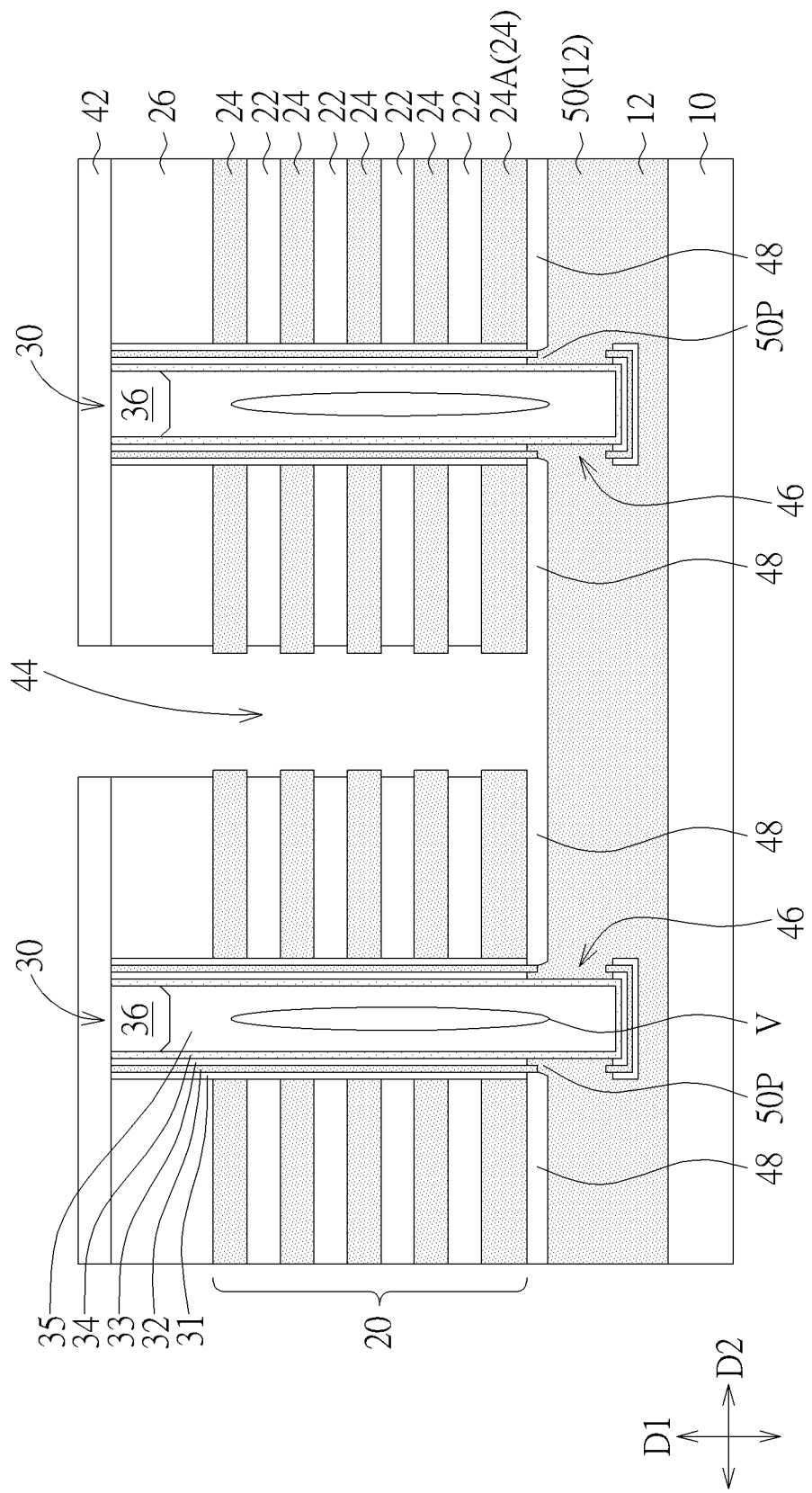
Figure 7:
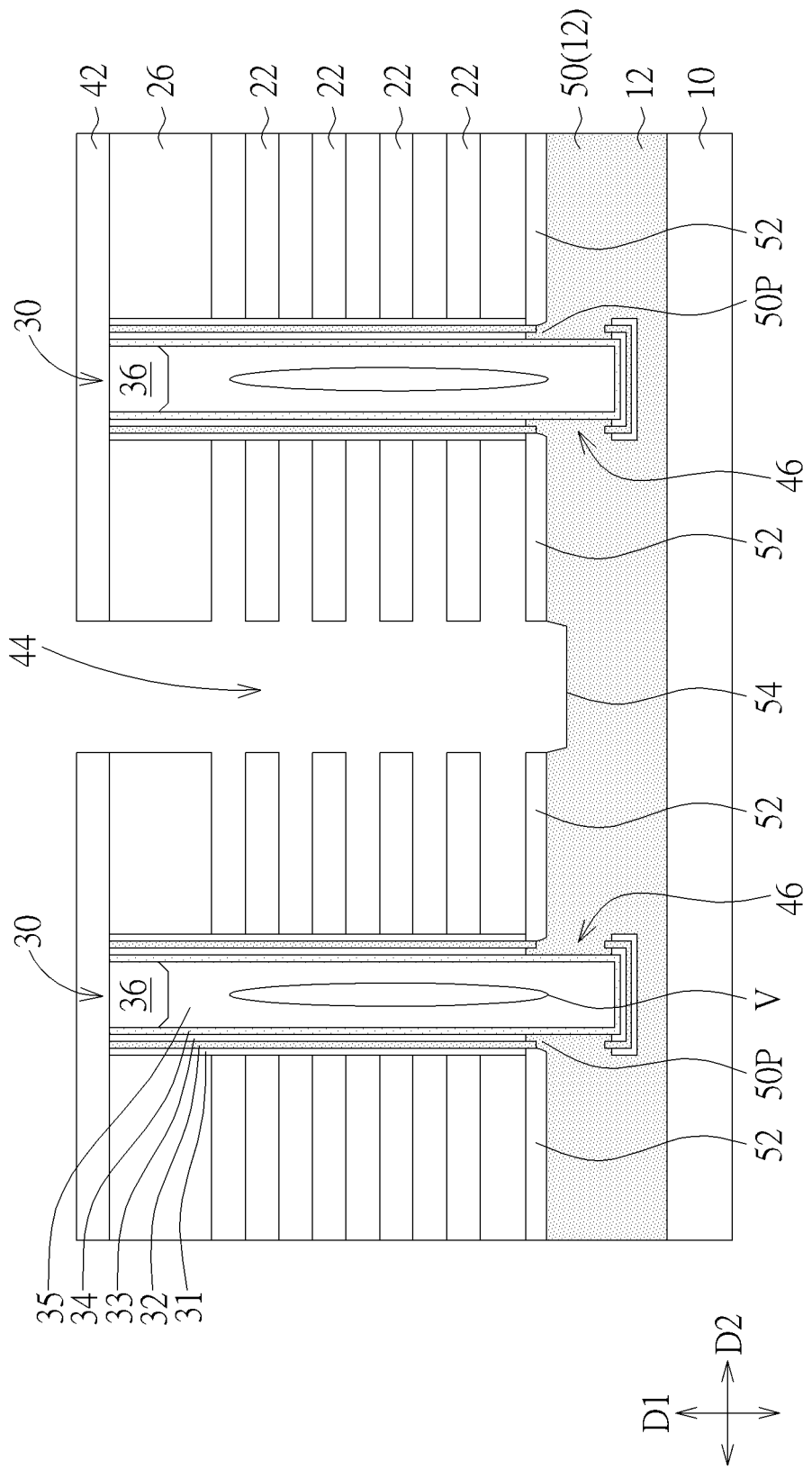

As shown in FIGS. 1, 6 and 7, in step S15, an insulating layer 52 is formed on the epitaxial layer 50. The insulating layer 52 may be located between the epitaxial layer 50 and the dielectric layers 22 of the alternating dielectric stack 20 in the vertical direction D1. The insulating layer 52 may be regarded as a replacement of the bottom dielectric layer in the alternating dielectric stack 20. In some embodiments, the insulating layer 52 may include an oxide layer, such as a silicon oxide layer, or other suitable insulating materials. In some embodiments, the insulating layer 52 may be formed by performing an oxidation process to the epitaxial layer 50, and the oxidation process may include a chemical oxidation treatment, a thermal oxidation treatment, or other suitable oxidation approaches. In some embodiments, the epitaxial layer 50 may be separated from the alternating dielectric stack 20 by the gap 48 before forming the insulating layer 52. In some embodiments, at least a part of the epitaxial layer 50 may be connected with the bottom sacrificial layer 24A of the alternating dielectric stack 20. In some embodiments, the epitaxial layer 50 may include a protruding part 50P located between the insulating layer 52 and the vertical structure 30 in the horizontal direction D2, and a top surface of the epitaxial layer 50 (such as a topmost surface of the protruding part 50P) may be higher than a bottom surface of the insulating layer 52 in the vertical direction D1, but not limited thereto. In addition, the sacrificial layers 24 of the alternating dielectric stack 20 may be removed. In some embodiments, the sacrificial layers 24 may be removed before the step of forming the insulating layer 52 for avoiding influencing the oxidation process performed to the epitaxial layer 50. In some embodiments, the sacrificial layers 24 may be removed after the step of forming the insulating layer 52 for controlling the thickness of the insulating layer 52. In some embodiments, a recess 54 may be formed at the bottom of the slit 44 by removing a part of the insulating layer 52 and a part of the epitaxial layer 50, but not limited thereto.

As shown in FIGS. 1, and 6-8, in step S16, the sacrificial layers 24 in the alternating dielectric stack 20 may be replaced with conductive layers 62 so as to form an alternating conductive/dielectric stack 60 including the dielectric layers 22 and the conductive layers 62 alternately stacked in the vertical direction D1. The conductive layers 62 may be formed after the step of forming the insulating layer 52, and the insulating layer 52 may be regarded as a bottom dielectric layer in the alternating conductive/dielectric stack 60, but not limited thereto. In some embodiments, a high-k dielectric layer and a barrier layer (not shown) may be formed between the vertical structure 30 and each of the conductive layers 62. The conductive layers 62 may include conductive materials including, but not limited to, W, Co, Cu, Al, doped silicon, polysilicon, silicide, or any combination thereof. The conductive layers 62 may be formed by thin film deposition processes, such as CVD, ALD, any other suitable process. A part of the conductive layers 62 corresponding to the slit 44 may be removed, and a second doped region 56 may be formed in the epitaxial layer 50 under the recess 54, but not limited thereto. In some embodiments, a source structure (not shown) may be formed in the slit 44 and connected with the second doped region 56.

In the manufacturing method of the present disclosure, the vertical structure 30 is formed before the step of forming the epitaxial layer 50, and the influence of the vertical structure 30 and/or the step of forming the vertical structure 30 on the epitaxial layer 50 may be avoided accordingly. The process window of forming the vertical structure 30 may be improved because it is not necessary to consider the influence of the vertical structure 30 on the epitaxial growth condition of the epitaxial layer 50. The bottom dielectric layer of the alternating dielectric stack may be replaced by the insulating layer 52 formed on the epitaxial layer 50 for reducing defects at the interface between the epitaxial layer and the bottom dielectric layer of the alternating dielectric stack. The manufacturing yield and the electrical performance of the 3D memory device may be enhanced accordingly.

Figure 8:
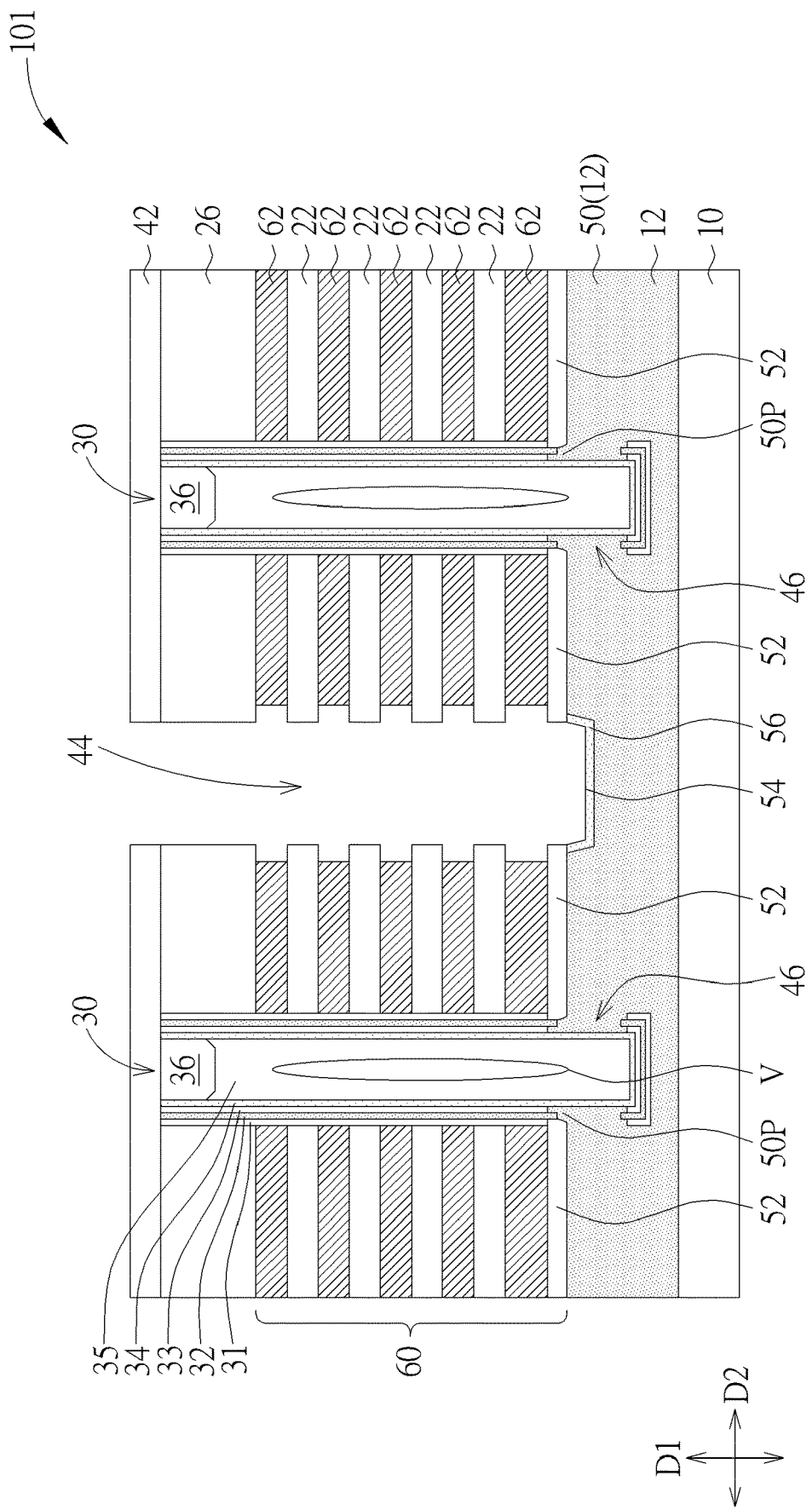

As shown in FIG. 8, a 3D memory device 101 may be formed by the manufacturing method described above. The 3D memory device 101 may include the substrate 10, the alternating conductive/dielectric stack 60, the epitaxial layer 50, and the vertical structures 30. The alternating conductive/dielectric stack 60 may be disposed on the substrate 10. The alternating conductive/dielectric stack 60 may include a plurality of the dielectric layers 22 and a plurality of the conductive layers 62 alternately stacked in the vertical direction D1, and the insulating layer 52 may be regarded as the bottom dielectric layer in the alternating conductive/dielectric stack 60. The epitaxial layer 50 may be disposed between the substrate 10 and the alternating conductive/dielectric stack 60 in the vertical direction D1. The vertical structure 30 may penetrate the alternating conductive/dielectric stack 60 in the vertical direction D1 for being partly disposed in the epitaxial layer 50. The epitaxial layer 50 may include the protruding part 50P disposed between the vertical structure 30 and the bottom dielectric layer (i.e. the insulating layer 52) of the alternating conductive/dielectric stack 60 in the horizontal direction D2.

In some embodiments, the bottom dielectric layer (i.e. the insulating layer 52) of the alternating conductive/dielectric stack 60 may surround the protruding part 50P of the epitaxial layer 50 in the horizontal direction D1. In some embodiments, the top surface of the epitaxial layer 50 (such as the topmost surface of the protruding part 50P) may be higher than the bottom surface of the bottom dielectric layer (i.e. the insulating layer 52) in the vertical direction D1. In some embodiments, the vertical structure 30 may include a vertical memory structure, such as a NAND string including the barrier layer 31, the storage layer 32, the tunneling layer 33, the semiconductor layer 34, the filling structure 35, and the conductive structure 36, but not limited thereto. The semiconductor layer 34 may surround the filling structure 35 in the horizontal direction D2, and the tunneling layer 33, the storage layer 32, and the barrier layer 31 may surround the semiconductor layer 34 in the horizontal direction D2. In some embodiments, the epitaxial layer 50 may contact a part of the semiconductor layer 34 disposed under the alternating conductive/dielectric stack 60 for being electrically connected with the semiconductor layer 34 of the vertical structure 30. In some embodiments, the protruding part 50P of the epitaxial layer 50 may surround and contact a part of the semiconductor layer 34 of the vertical structure 30. In some embodiments, the epitaxial layer 50 may include a doped well region on the substrate 10. In some embodiments, the epitaxial layer 50 may be regarded as a lateral extending channel structure of a bottom select gate (BSG) transistor in a NAND memory structure, and the semiconductor layer 34 of the vertical structure 30 may be electrically connected to the doped well (e.g. the first doped region 12) via the epitaxial layer 50 for avoiding some operation issues of the 3D memory device 101, such as hole erase operation induced by gate induced drain leakage (GIDL). The electrical performance of the 3D memory device 101 may be enhanced accordingly.

The following description will detail the different embodiments of the present disclosure. To simplify the description, identical components in each of the following embodiments are marked with identical symbols. For making it easier to understand the differences between the embodiments, the following description will detail the dissimilarities among different embodiments and the identical features will not be redundantly described.

Figure 9:
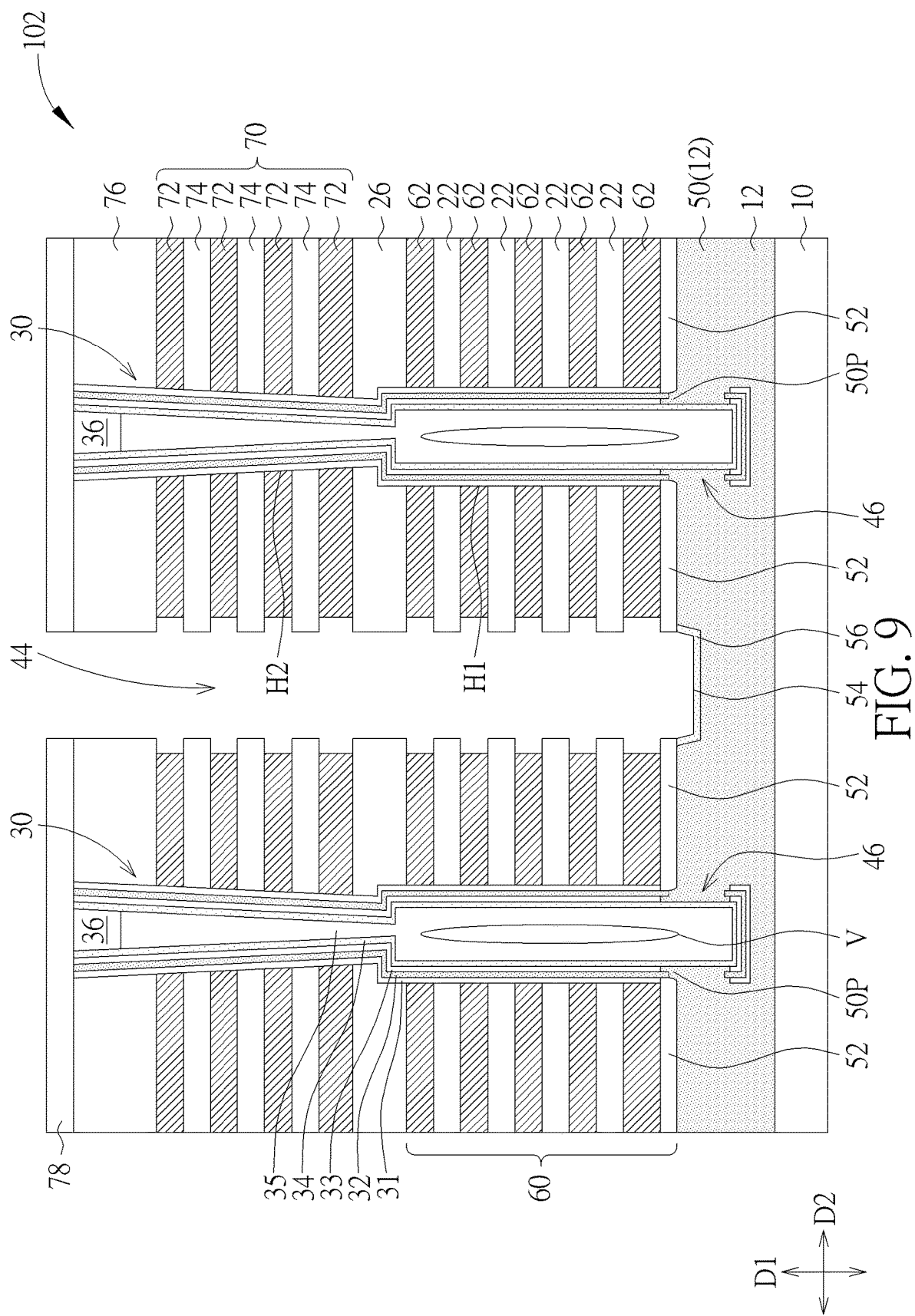
FIG. 9 is a schematic drawing illustrating a 3D memory device according to a second embodiment of the present disclosure.
Figure 10:
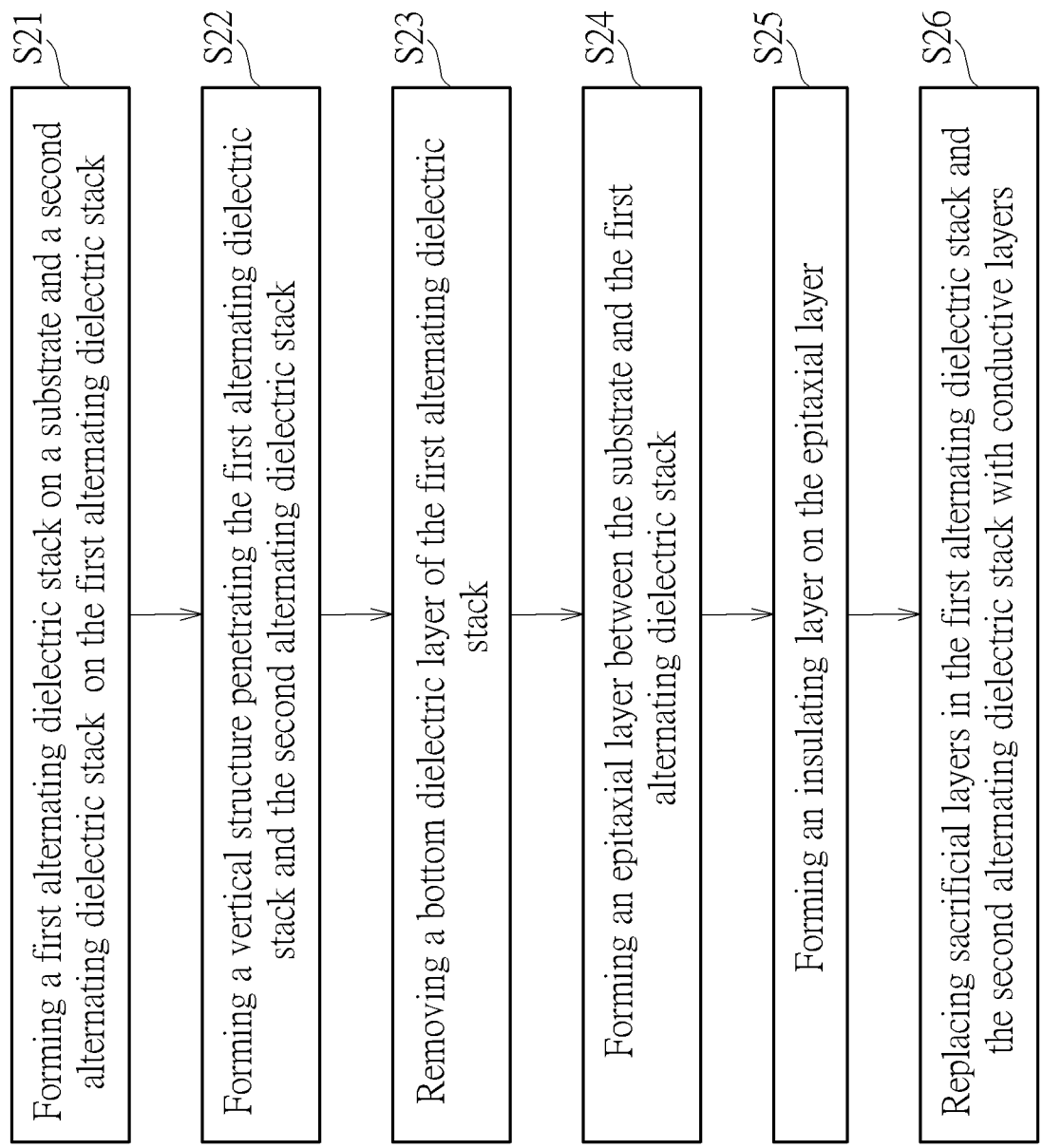
FIG. 10 is a flowchart of a manufacturing method of a 3D memory device according to the second embodiment of the present disclosure.

Please refer to FIG. 9 and FIG. 10. FIG. 9 is a schematic drawing illustrating a 3D memory device 102 according to a second embodiment of the present disclosure, and FIG. 10 is a flowchart of a manufacturing method of the 3D memory device 102 in this embodiment. As shown in FIG. 9, the difference between the 3D memory device 102 and the 3D memory device in the first embodiment described above is that the 3D memory device 102 may further include another alternating conductive/dielectric stack 70 disposed on the alternating conductive/dielectric stack 60. For example, the alternating conductive/dielectric stack 60 may be regarded as a first alternating conductive/dielectric stack, the alternating conductive/dielectric stack 70 may be regarded as a second alternating conductive/dielectric stack, and the 3D memory device 102 may be regarded as a dual-deck 3D memory structure. The alternating conductive/dielectric stack 70 may include a plurality of conductive layers 72 and a plurality of dielectric layers 72 alternately stacked in the vertical direction D1. The material of the conductive layer 72 may be similar to that of the conductive layer 62, and the material of the dielectric layer 74 may be similar to that of the dielectric layer 22, but not limited thereto. In addition, the vertical structure 30 in the 3D memory device 102 may vertically penetrate the alternating conductive/dielectric stack 70 and the alternating conductive/dielectric stack 60. In some embodiments, a lower portion of the vertical structure 30 may be disposed in a first channel hole H1 penetrating the alternating conductive/dielectric stack 60, and a upper portion of the vertical structure 30 may be disposed in a second channel hole H2 penetrating the alternating conductive/dielectric stack 70. The first channel hole H1 and the second channel hole H2 may be formed separately, and the shape and/or the size of the second channel hole H2 may be different from that of the first channel hole H1, but not limited thereto. In some embodiments, the second channel hole H2 may further penetrates a third cap layer 76 disposed on the alternating conductive/dielectric stack 70, and a fourth cap layer 78 may be disposed on the third cap layer 76 and the vertical structure 30.

As shown in FIG. 9 and FIG. 10, the manufacturing method of the 3D memory device 102 may include but is not limited to the following steps. In step S21, a first alternating dielectric stack may be formed on the substrate 10, and a second alternating dielectric stack may be formed on the first alternating dielectric stack. The structure and the material composition of the first alternating dielectric stack and the second alternating dielectric stack may be similar to the alternating dielectric stack shown in FIG. 2 of the first embodiments described above. In step S22, the vertical structure 30 may be formed penetrating the first alternating dielectric stack and the second alternating dielectric stack. In some embodiments, the first channel hole H1 penetrating the first alternating dielectric stack may be formed before the step of forming the second alternating dielectric stack, but not limited thereto. Subsequently, steps S23-S25 are carried out. The bottom dielectric layer of the first alternating dielectric stack is removed, the epitaxial layer 50 is formed between the substrate 10 and the first alternating dielectric stack, and the insulating layer 52 is formed on the epitaxial layer 50. The details of the steps S23-S25 may be similar to those of the steps S13-S15 in FIGS. 1 and 4-7 of the first embodiment described above and will not be redundantly described. Subsequently, in step S26, sacrificial layers in the first alternating dielectric stack and the second alternating dielectric stack may be replaced with conductive layers (such as the conductive layers 62 and the conductive layers 72) for forming the alternating conductive/dielectric stack 60 and the alternating conductive/dielectric stack 70 respectively. It is worth noting that the vertical structure 30 may be formed before the step of forming the epitaxial layer 50, and the influence of the vertical structure 30 and/or the step of forming the vertical structure 30 on the epitaxial layer 50 may be avoided accordingly. The process window of forming the vertical structure 30, such as the window of the overlay condition between the first channel hole H1 and the second channel hole H2, may be improved because it is not necessary to consider the influence of the vertical structure 30 and/or the step of forming the vertical structure 30 on the epitaxial growth condition of the epitaxial layer 50. The manufacturing yield of the 3D memory device may be enhanced accordingly.

To summarize the above descriptions, in the 3D memory device and the manufacturing method thereof in the present disclosure, the vertical structure may be formed before the step of forming the epitaxial layer for avoiding the influence of the vertical structure and/or the process of forming the vertical structure on the epitaxial layer. The process window of forming the vertical structure may be improved because it is not necessary to consider the influence of the vertical structure and/or the process of forming the vertical structure on the epitaxial growth condition of the epitaxial layer. The bottom dielectric layer of the alternating dielectric stack may be replaced by the insulating layer formed on the epitaxial layer for reducing defects at the interface between the epitaxial layer and the bottom dielectric layer of the alternating dielectric stack. The manufacturing yield and the electrical performance of the 3D memory device may be enhanced accordingly. In addition, for a dual-deck or other multiple-deck 3D memory structure, the manufacturing yield may be further improved because the overlay window between the channel holes may be enlarged by the manufacturing method of the present disclosure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A three-dimensional (3D) memory device, comprising:
   a substrate;
   an alternating conductive/dielectric stack disposed on the substrate, the alternating conductive/dielectric stack comprising a plurality of dielectric layers and a plurality of conductive layers alternately stacked in a vertical direction perpendicular to a surface of the substrate;
   an epitaxial layer disposed between the substrate and the alternating conductive/dielectric stack in the vertical direction; and
   a vertical structure penetrating the alternating conductive/dielectric stack in the vertical direction for being partly disposed in the epitaxial layer, wherein the epitaxial layer comprises a protruding part disposed between the vertical structure and a bottom dielectric layer of the alternating conductive/dielectric stack in a horizontal direction orthogonal to the vertical direction, wherein the epitaxial layer is a doped well region comprising the protruding part and disposed on the substrate.

2. The 3D memory device according to claim 1, wherein the bottom dielectric layer of the alternating conductive/dielectric stack surrounds the protruding part of the epitaxial layer in the horizontal direction.

3. The 3D memory device according to claim 1, wherein a top surface of the epitaxial layer is higher than a bottom surface of the bottom dielectric layer in the vertical direction.

4. The 3D memory device according to claim 1, wherein the vertical structure comprises a semiconductor layer and a storage layer surrounding the semiconductor layer.

5. The 3D memory device according to claim 4, wherein the epitaxial layer contacts the semiconductor layer of the vertical structure.

6. The 3D memory device according to claim 4, wherein the protruding part of the epitaxial layer surrounds and contacts the semiconductor layer of the vertical structure.

7. The 3D memory device according to claim 4, wherein the epitaxial layer directly contacts the storage layer.

* * * * *